(12) United States Patent
Kawaguchi

(10) Patent No.: US 8,809,944 B2
(45) Date of Patent: Aug. 19, 2014

(54) SEMICONDUCTOR DEVICE INCLUDING A TRANSISTOR WITH GATE IN A TRENCH AND A DOPED REGION UNDER THE TRENCH TO MODIFY THE THRESHOLD VOLTAGE

(75) Inventor: Hiroshi Kawaguchi, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/598,000

(22) Filed: Aug. 29, 2012

(65) Prior Publication Data

US 2012/0319196 A1 Dec. 20, 2012

Related U.S. Application Data

(63) Continuation of application No. 12/820,531, filed on Jun. 22, 2010, now Pat. No. 8,319,279.

(30) Foreign Application Priority Data

Jun. 26, 2009 (JP) ................. 2009-152954

(51) Int. Cl.
*H01L 27/108* (2006.01)
*H01L 29/94* (2006.01)

(52) U.S. Cl.
USPC ............ 257/330; 257/332; 257/E21.443; 257/E29.201

(58) Field of Classification Search
USPC ............ 257/244, 330, 332, E29.201, E29.26, 257/E21.668, E29.257, E29.031, E21.429, 257/E21.443
See application file for complete search history.

(56) References Cited

U.S. PATENT DOCUMENTS

| | | | |
|---|---|---|---|
| 5,371,024 A * | 12/1994 | Hieda et al. .................. | 438/291 |
| 6,452,231 B1 | 9/2002 | Nakagawa et al. | |
| 6,919,601 B2 | 7/2005 | Inaba | |
| 7,242,058 B2 | 7/2007 | Risaki | |
| 7,391,068 B2 | 6/2008 | Kito et al. | |
| 2006/0049455 A1* | 3/2006 | Jang et al. ..................... | 257/330 |
| 2007/0007571 A1* | 1/2007 | Lindsay et al. ............... | 257/306 |
| 2008/0185639 A1* | 8/2008 | Risaki et al. .................. | 257/330 |

FOREIGN PATENT DOCUMENTS

JP 04-276662 10/1992
JP 6-302817 10/1994

OTHER PUBLICATIONS

Japanese Office Action dated May 28, 2013 in corresponding Japanese Patent Application No. 2009-152954 with English translation of Japanese Office Action.

* cited by examiner

*Primary Examiner* — William F Kraig
*Assistant Examiner* — Khaja Ahmad
(74) *Attorney, Agent, or Firm* — Young & Thompson

(57) ABSTRACT

A semiconductor device includes a transistor with a substrate on which source and drain regions, both of a first conductivity type, and a channel region of a second conductivity type between the source and drain are formed, and a gate electrode formed in the channel region to bury a trench formed so the depth thereof changes intermittently in the width direction of the gate. In the channel region, each on a surface of the substrate and in a bottom portion of the trench, there are formed a second high-concentration region and a first high-concentration region, and the dopant concentration of the second conductivity type is higher than the dopant concentration of the second conductivity type in portions sideward from the trench. The dopant concentration of the second conductivity type in the first high-concentration region is higher than the dopant concentration of the second conductivity type in the second high-concentration region.

20 Claims, 16 Drawing Sheets

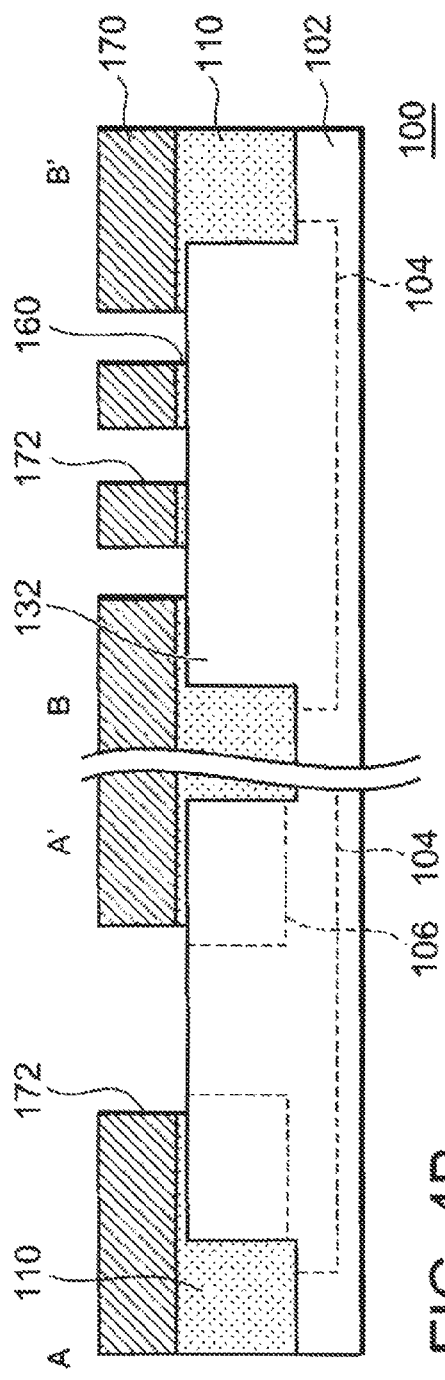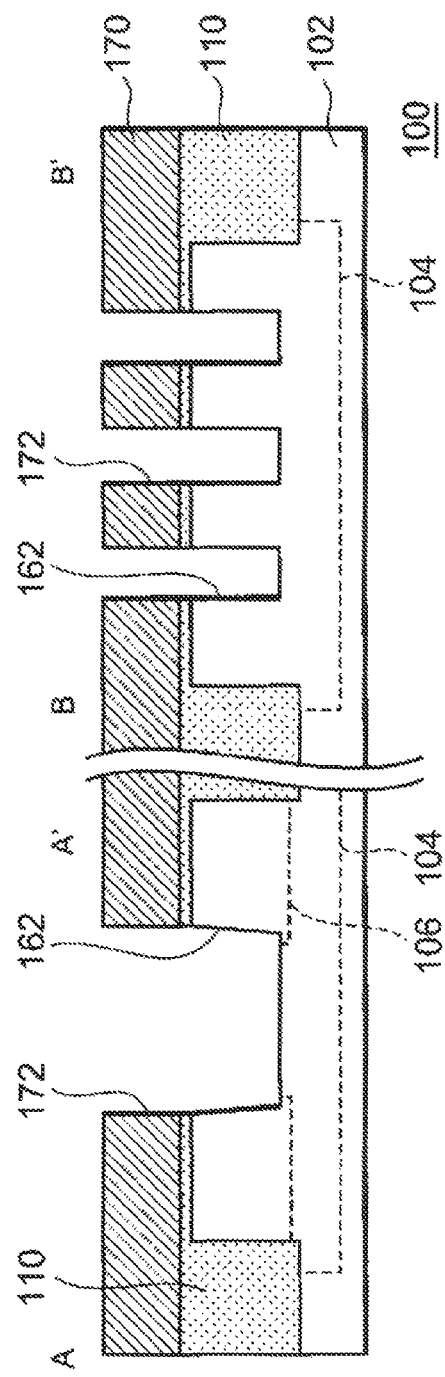

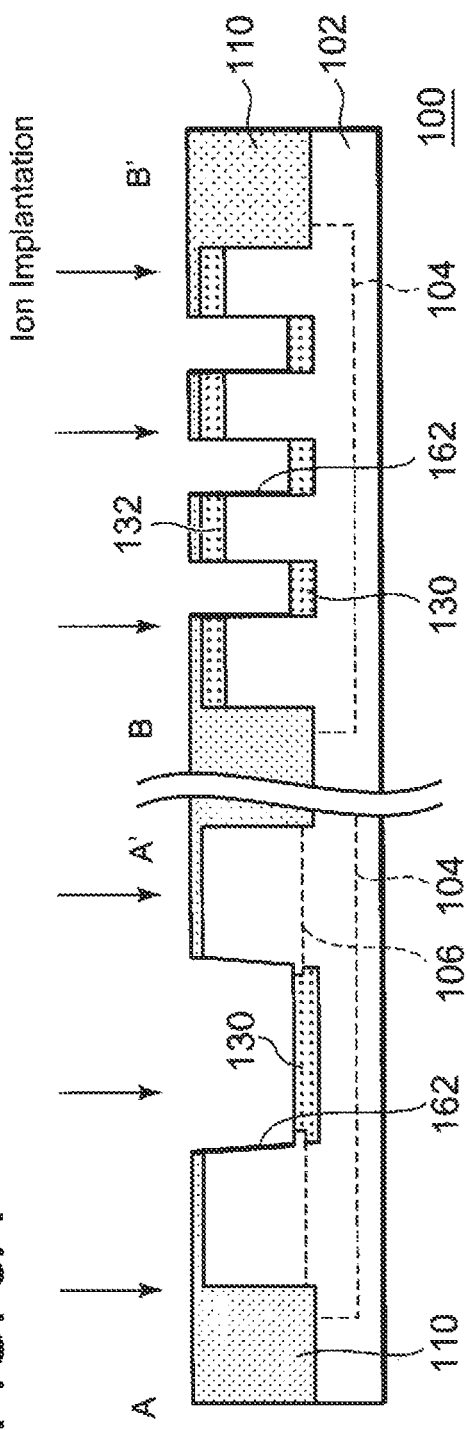
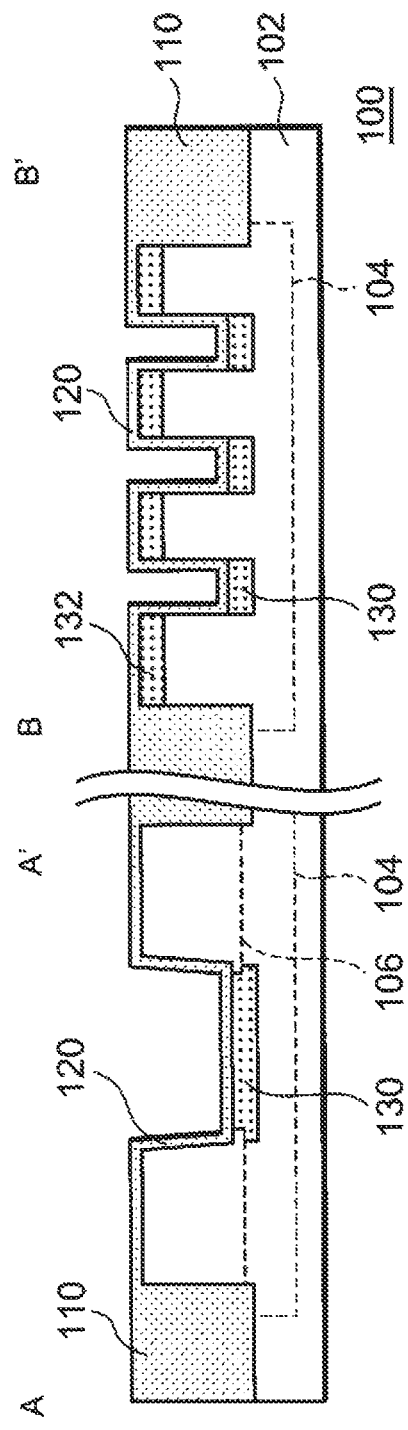

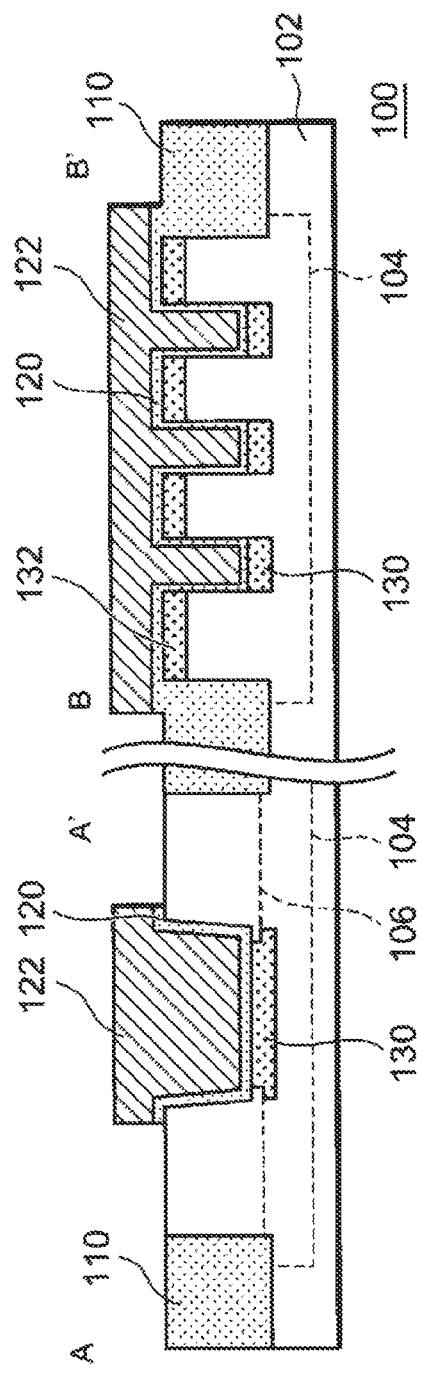
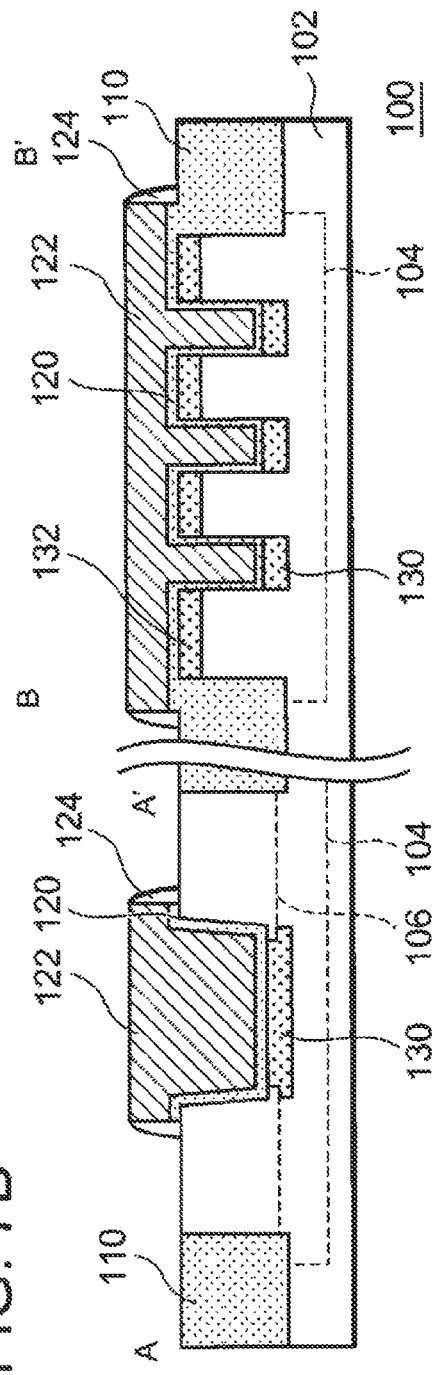
FIG. 7A
FIG. 7B

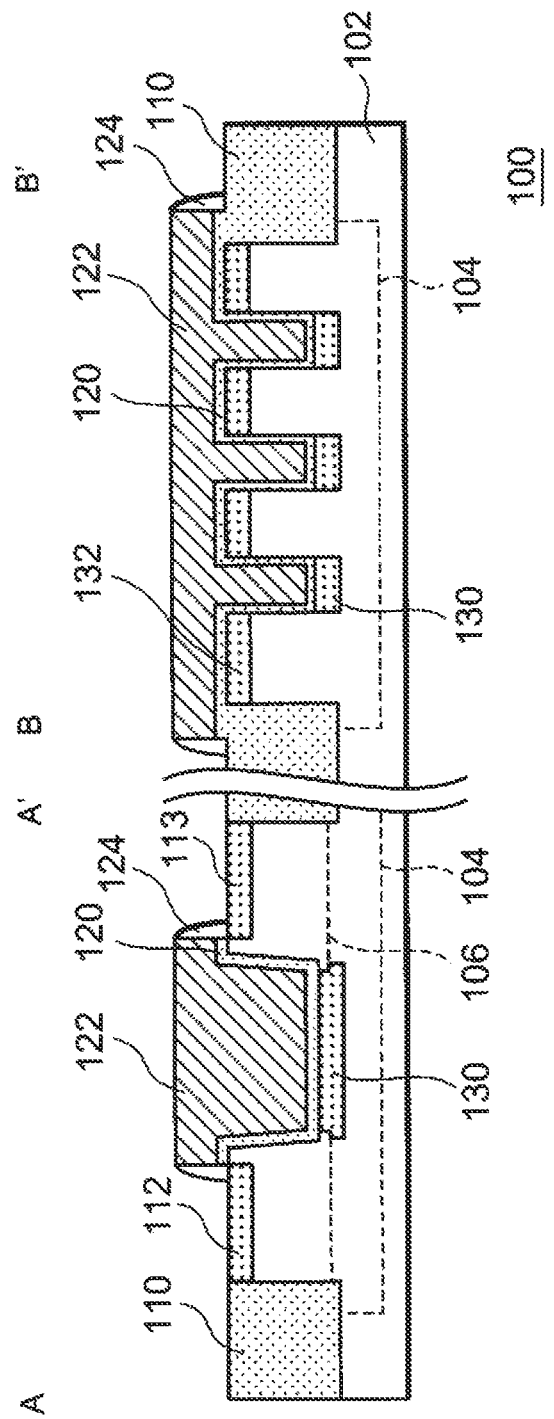

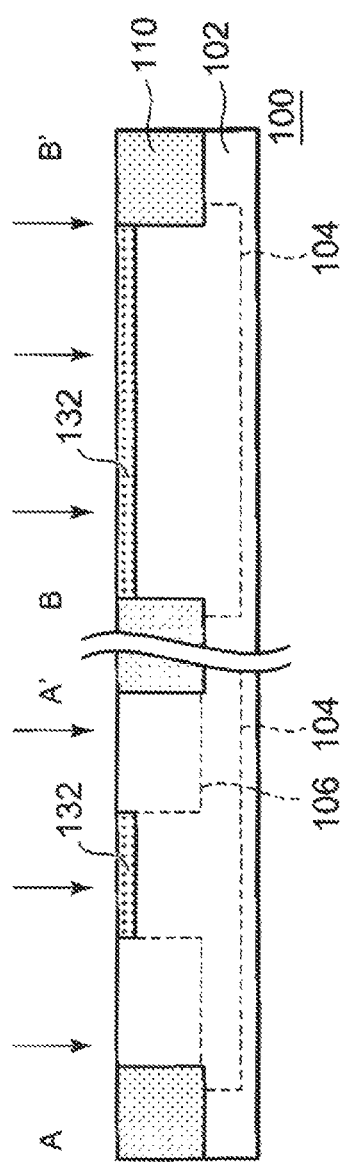
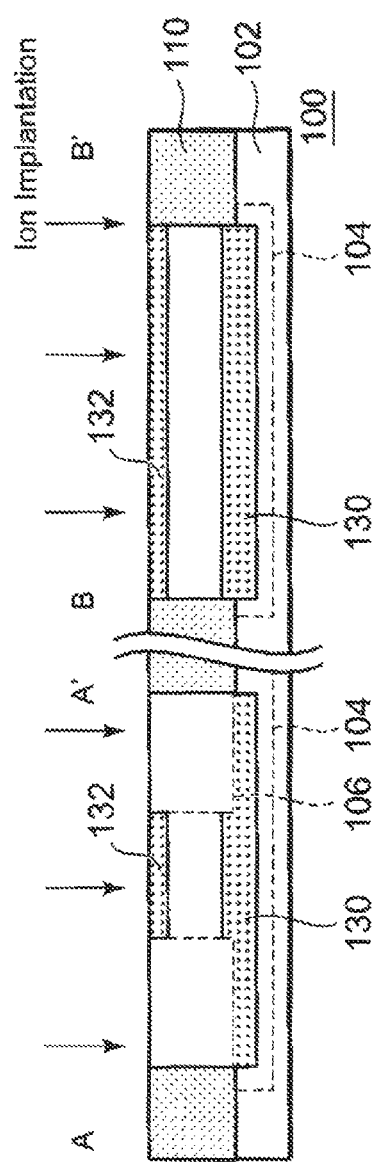
FIG. 9A
FIG. 9B

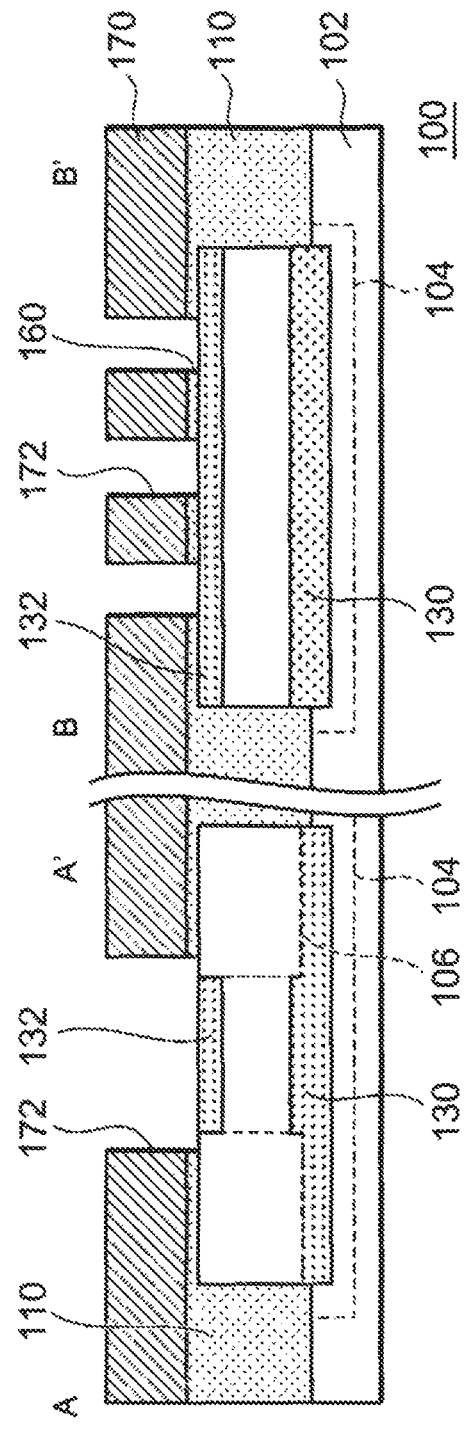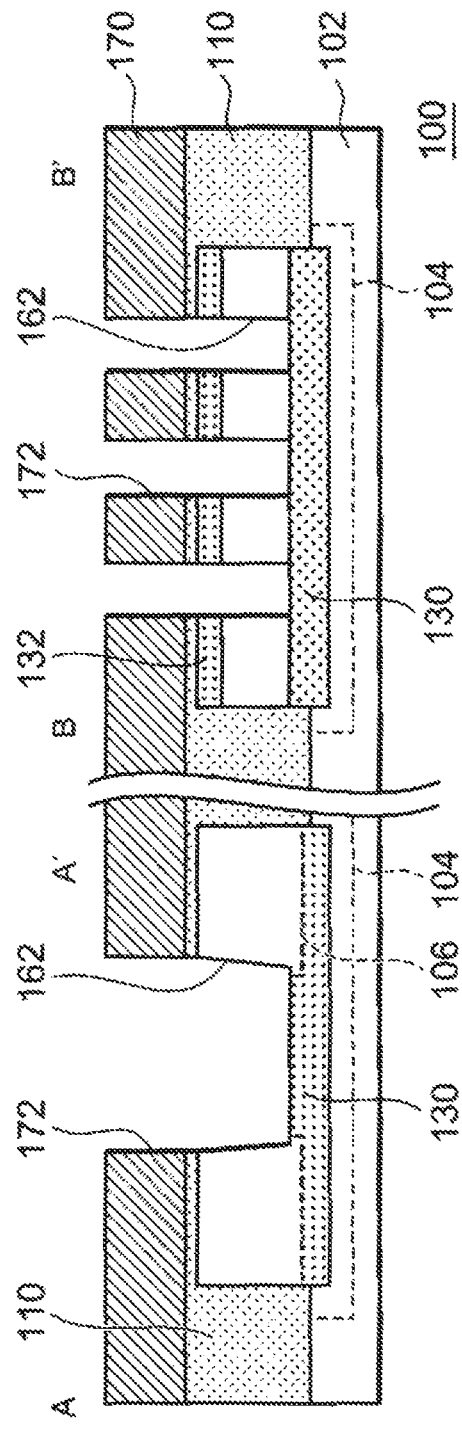

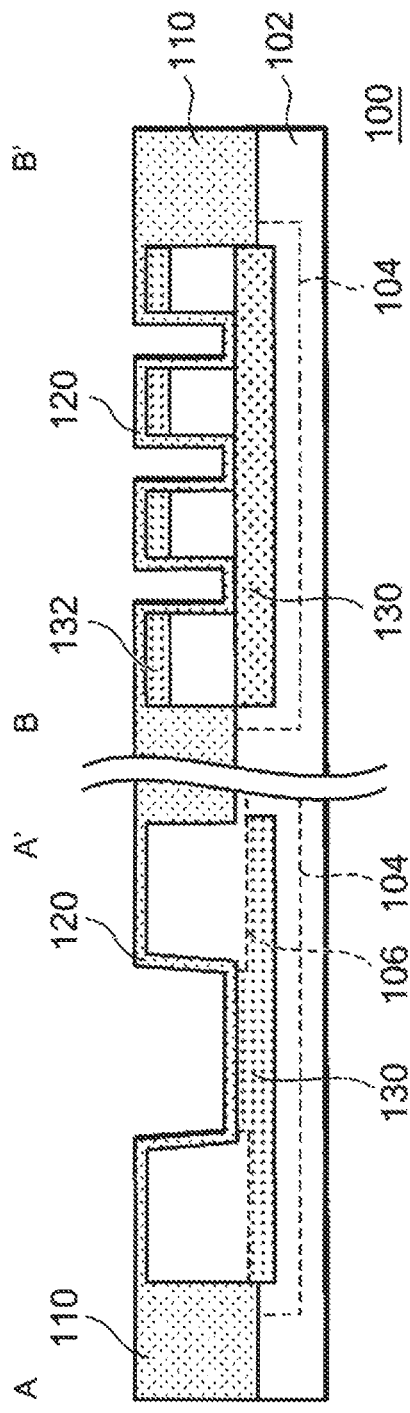
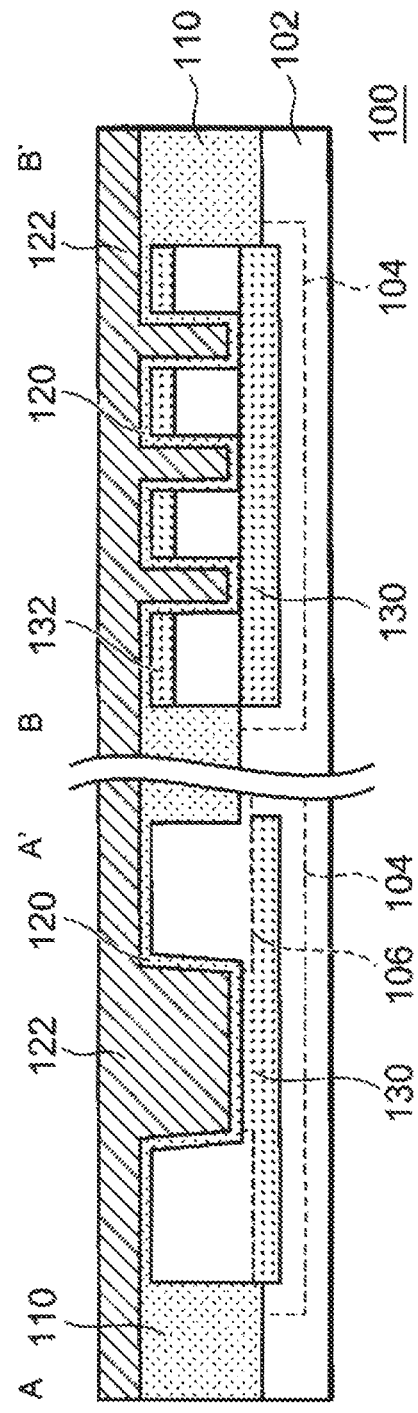

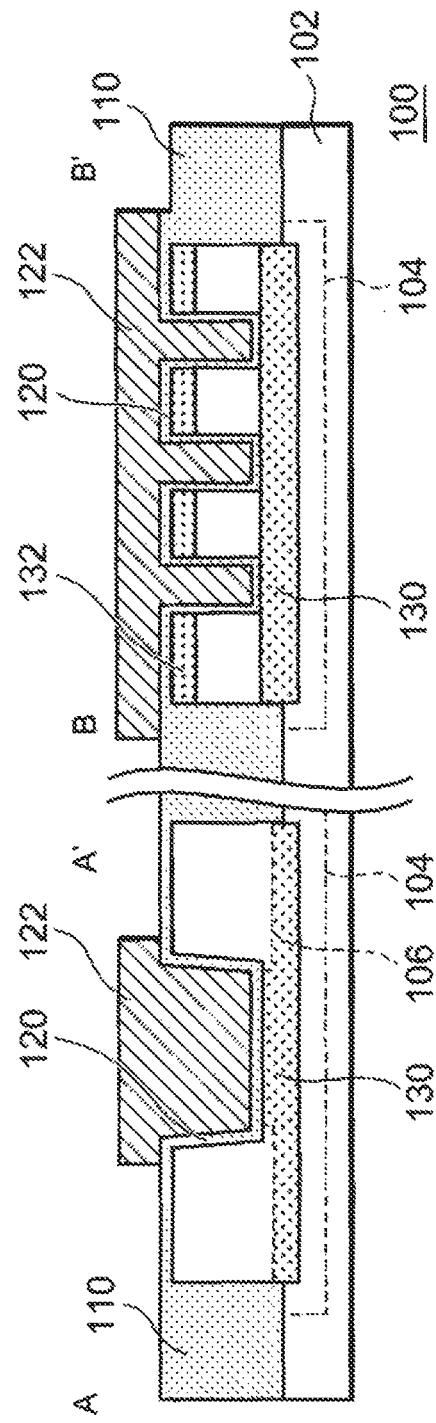
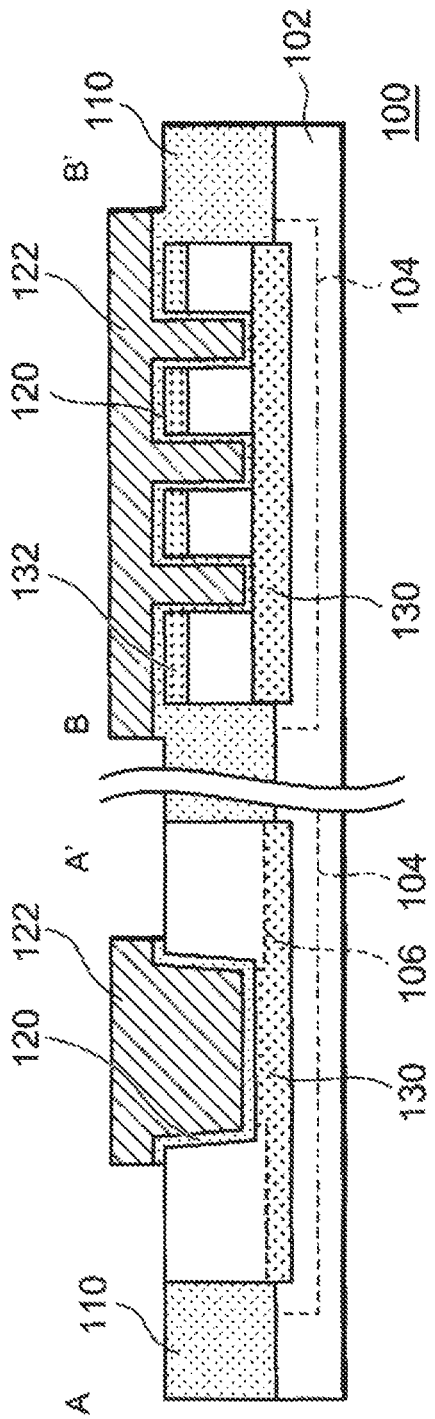
FIG. 12A
FIG. 12B

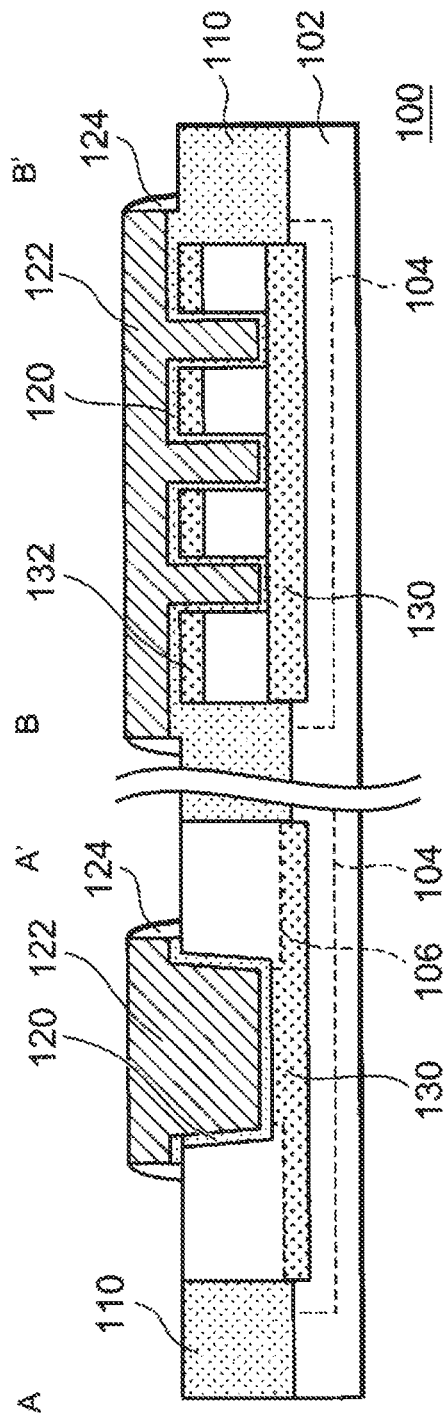

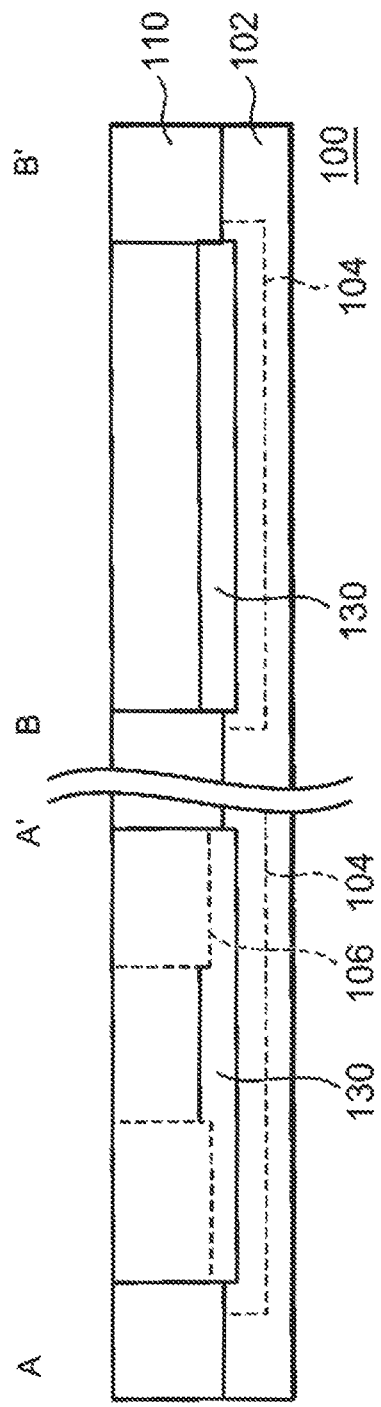

SEMICONDUCTOR DEVICE INCLUDING A TRANSISTOR WITH GATE IN A TRENCH AND A DOPED REGION UNDER THE TRENCH TO MODIFY THE THRESHOLD VOLTAGE

CROSS REFERENCE TO RELATED APPLICATIONS

This application is a continuation of application Ser. No. 12/820,531 filed on Jun. 22, 2010, which claims foreign priority to Japanese Application No. 152954/09 filed on Jun. 26, 2009. The entire content of each of these applications is hereby expressly incorporated by reference.

BACKGROUND OF THE INVENTION

1. Field of the Invention

The present invention relates to a semiconductor device.

2. Description of Related Art

Techniques have been proposed for forming uneven surfaces such as trenches in the channel region of a substrate, to increase the effective channel width of a transistor without an increase in size.

For example, Japanese Patent Laid-Open No. H11-103058, corresponding to U.S. Pat. No. 6,452,231, and Japanese Patent Laid-Open No. S51-147269 describe a semiconductor device including a trench transistor structure in which trenches are formed on the substrate surface. Japanese Patent Laid-Open No. 2007-5568, corresponding to U.S. Pat. No. 7,391,068, describes a semiconductor device in which a plurality of projecting silicon regions are formed in the width direction of a channel region formed between a source region and a drain region which are formed on a semiconductor substrate. A gate insulating film and a gate electrode are formed facing the channel region on the silicon projections. A reduction in the pitch of the gates reduces the width of the projections and achieves full depletion of a depletion layer in the projections during the operation of transistors, thus mitigating the short channel effect and improving the subthreshold slope (Japanese Patent Laid-Open No. 2005-085960, corresponding to U.S. Pat. No. 6,919,601). It is also possible to use, as an advantage, such a decrease in the substrate bias dependence of threshold voltage due to such full depletion in an appropriate circuit configuration. Japanese Patent Laid-Open No. 2008-53468 describes a technique which involves performing oblique ion implantation on a substrate in which trenches are formed and performing thermal diffusion thereafter.

However, the present inventors discovered that trench transistor structures such as those described in U.S. Pat. No. 6,452,231, Japanese Patent Laid-Open No. 551-147269, U.S. Pat. No. 7,391,068 and U.S. Pat. No. 6,919,601 have a problem in that, despite applying a constant voltage to a gate electrode, the variation in the shape of the gate electrode creates electric field concentration at the top and bottom regions of the trenches, such that the electric field becomes high in these regions. For this reason, a localized decrease in threshold voltage occurs. Regions where the threshold voltage has decreased in this manner act like parasitic transistors and phenomena such as hump and kink occur; that is, a drain current flows at a lower gate voltage. The subthreshold characteristics of such transistors are thereby compromised.

SUMMARY OF THE INVENTION

According to the present invention, there is provided a semiconductor device including a transistor which has a substrate, a source region and a drain region, both of which are of a first conductivity type, a channel region of a second conductivity type between the source region and the drain region, a trench formed in the substrate between the source region and the drain region, and a gate electrode formed in the trench.

In this semiconductor device, the dopant concentration of the channel region at a bottom portion of the trench and the dopant concentration of the channel region at a surface of the substrate bounding the trench are both higher than the dopant concentration of the channel region bounding intermediate side walls of the trench, with all of these channel regions preferably being doped with ions of the same conductivity type.

The dopant concentration of the channel region at the bottom portion of the trench is preferably also higher than the dopant concentration of the channel region at the surface of the substrate bounding the trench.

According to the present invention, there is also provided a method of manufacturing a semiconductor device comprising: forming a device isolation film on a substrate, forming a photoresist on the substrate, forming a pattern on the photoresist so as to expose a gate region, forming a trench in the substrate through the pattern, forming a channel region by removing the pattern and implanting dopant ions of a second conductivity type, forming a gate electrode in the trench formed on the substrate, and forming a source region and a drain region by implanting dopant ions of a first conductivity type in the regions laterally adjacent the channel region of the substrate.

The ion implantation of the dopant ions of the second conductivity type to form the channel region is preferably performed perpendicular to the substrate.

According to this configuration, at the top and bottom trench areas of the channel region where electric field concentration is apt to occur, the second conductivity type dopant concentration is higher than in other regions of the channel and therefore it is possible to increase the threshold voltage in these regions. This permits preventing the parasitic transistor effect and phenomena such as hump and kink. The subthreshold characteristics of such transistors can be thereby improved.

BRIEF DESCRIPTION OF THE DRAWINGS

The above and other objects, advantages and features of the present invention will be more apparent from the following description taken in conjunction with the accompanying drawings, in which:

FIGS. 4A and 4B are sectional views illustrating an example of steps of the procedure for manufacturing the semiconductor device in the embodiment of the present invention;

FIGS. 5A and 5B are sectional views illustrating an example of steps of the procedure for manufacturing the semiconductor device in the embodiment of the present invention;

FIGS. 7A and 7B are sectional views illustrating an example of steps of the procedure for manufacturing the semiconductor device in the embodiment of the present invention;

FIG. 8 is a sectional view illustrating an example of steps of the procedure for manufacturing the semiconductor device in the embodiment of the present invention;

FIGS. 9A and 9B are sectional views illustrating another example of steps of a procedure for manufacturing a semiconductor device in the embodiment of the present invention;

FIGS. 10A and 10B are sectional views illustrating another example of steps of the procedure for manufacturing the semiconductor device in the embodiment of the present invention;

FIGS. 11A and 11B are sectional views illustrating another example of steps of the procedure for manufacturing the semiconductor device in the embodiment of the present invention;

FIGS. 12A and 12B are sectional views illustrating another example of steps of the procedure for manufacturing the semiconductor device in the embodiment of the present invention;

FIGS. 13A and 13B are sectional views illustrating another example of steps of the procedure for manufacturing the semiconductor device in the embodiment of the present invention;

FIG. 15 is a sectional view illustrating a further example of steps of a procedure for manufacturing a semiconductor device in an embodiment of the present invention.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be described with the aid of the drawings. Incidentally, in all of the drawings, like component elements bear like symbols and descriptions of such component elements are appropriately omitted.

Figure 1A:
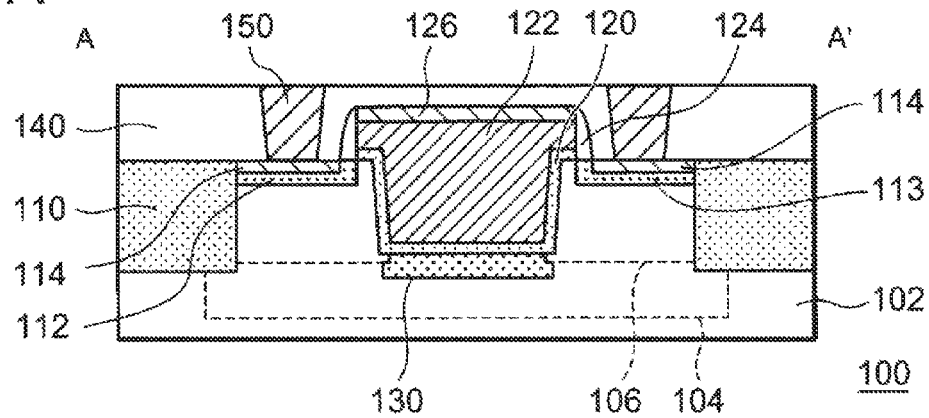
FIGS. 1A to 1C are sectional views illustrating an example of the configuration of a semiconductor device in an embodiment of the present invention.
Figure 1B:
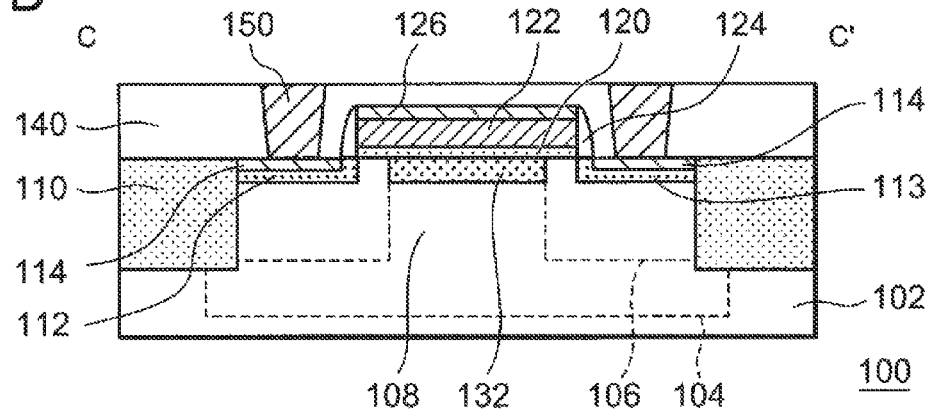
Figure 1C:
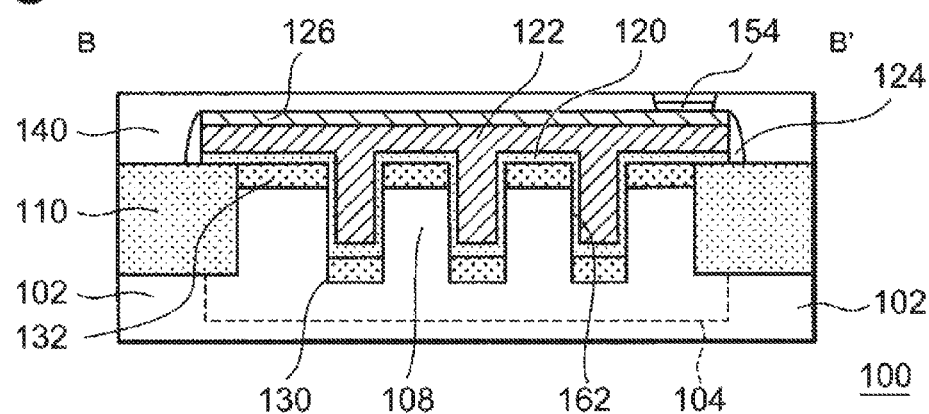
Figure 2:
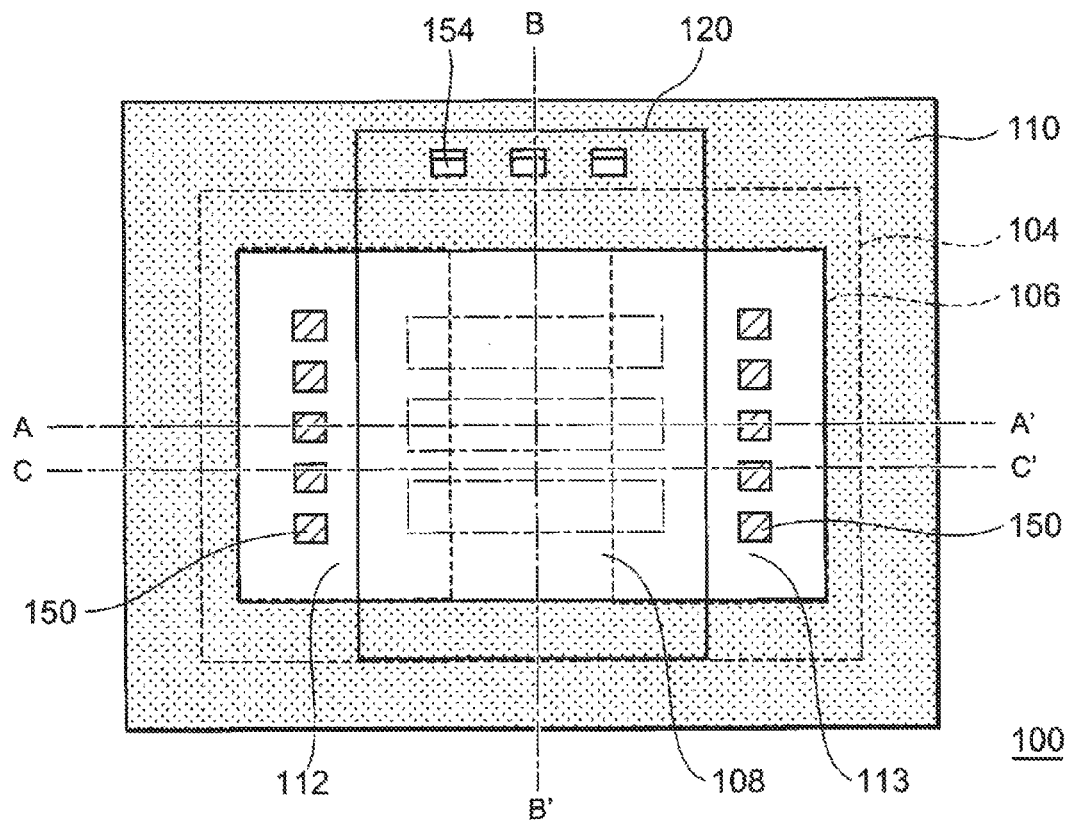
FIG. 2 is a plan view illustrating the example of the configuration of the semiconductor device in the embodiment of the present invention.

FIGS. 1A to 1C are sectional views illustrating an example of the configuration of a semiconductor device in an embodiment of the present invention. FIG. 2 is a plan view illustrating the example of the configuration of the semiconductor device in the embodiment of the present invention. FIG. 1A is an A-A' sectional view of FIG. 2, FIG. 1B is a C-C' sectional view of FIG. 2, and FIG. 1C is a B-B' sectional view of FIG. 2. To ensure that the configuration is easily understandable, in FIG. 2 each region is indicated by lines alone. In the following, a case where a first conductivity type is an n-type and a second conductivity is a p-type is described as an example. However, a reverse case may also be applied to the present invention.

A semiconductor device 100 includes a substrate 102 and transistors formed on the side of one surface of the substrate 102. The substrate 102 can be a semiconductor substrate such as a silicon substrate. A device isolation insulating film 110 is formed on one surface of the substrate 102. In a region isolated by the device isolation insulating film 110 on one surface of the substrate 102, there are formed a well 104, which is a diffusion region of a dopant of a second conductivity type (a p-type), a source region 112 and a drain region 113, which are diffusion regions of a first conductivity type (an n-type), and offset regions 106, which are each provided on circumferences of the source region 112 and the drain region 113 and are diffusion regions of a dopant of the first conductivity type (the n-type). The offset regions 106, the source region 112 and the drain region 113 are formed within the well 104, and a region of the well 104 provided between the source region 112 and the drain region 113 and defined by the offset regions 106 becomes a channel region 108 of the second conductivity type (the p-type). Incidentally, also in FIGS. 1A to 1C, to make the configuration understandable, the well 104 and the offset regions 106 are indicated by lines (broken lines) alone.

The semiconductor device 100 includes, in the channel region 108 on one surface of the substrate 102, trenches 162 formed so as to change the depth thereof intermittently in the gate width direction, a gate electrode 122 formed so as to bury the interior of the trenches 162, a gate insulating film 120 formed between the gate electrode 122 and the substrate 102, and side walls 124 formed on side walls of the gate electrode 122. In this embodiment, a silicide layer 114 is formed on the surfaces of the source region 112 and the drain region 113, and a silicide layer 126 is formed on the surface of the gate electrode 122. An interlayer dielectric film 140 is formed on the substrate 102. In the interlayer dielectric film 140, there are formed contacts 150 which are connected to the silicide layers 114, respectively, on the source region 112 and the drain region 113, and a contact 154 connected the silicide layer 126 on the gate electrode 122.

In this embodiment, in the bottom portion of the trench 162 of the channel region 108, there is formed a first high-concentration region 130 of the second conductivity type (the p-type), which has a higher dopant concentration than the channel region 108. On the surface of the channel region 108, there is formed a second high-concentration region 132 of the second conductivity type (the p-type), which has a higher dopant concentration than the channel region 108. The second conductivity type dopant concentration in the first high-concentration region 130 is set at a higher value than the second conductivity type dopant concentration in the second high-concentration region 132. That is, in this embodiment, in the channel region 108, the second conductivity type dopant concentration on the surface of the substrate 102 and in the bottom portion of the trench 162 can be higher than the second conductivity type dopant concentration in portions sideward from the trench 162 and the second conductivity type dopant concentration in the bottom portion of the trench 162 can be higher than the second conductivity type dopant concentration of the surface of the substrate 102. Due to such a configuration, it is possible to improve the subthreshold characteristics of transistors while keeping the driving capability of transistors appropriate and it is possible to prevent a decrease in breakdown voltage.

Next, a procedure for manufacturing a semiconductor device 100 in this embodiment will be described.

FIGS. 3A and 3B to FIG. 8 are sectional views illustrating an example of steps of a procedure for manufacturing a semiconductor device 100 in this embodiment. These figures correspond to the A-A' sectional view and B-B' sectional view of FIG. 2.

Incidentally, in the following, the description will be given only of the processing in a region where n-type transistors are formed.

Figure 3A:
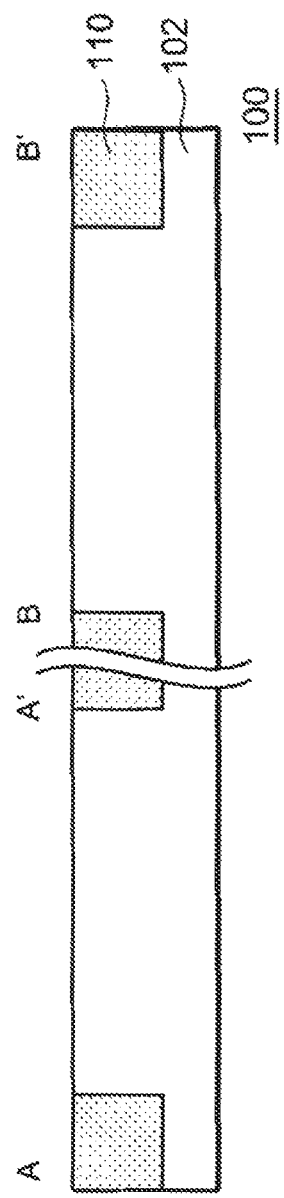
FIGS. 3A and 3B are sectional views illustrating an example of steps of a procedure for manufacturing a semiconductor device in the embodiment of the present invention.
Figure 3B:
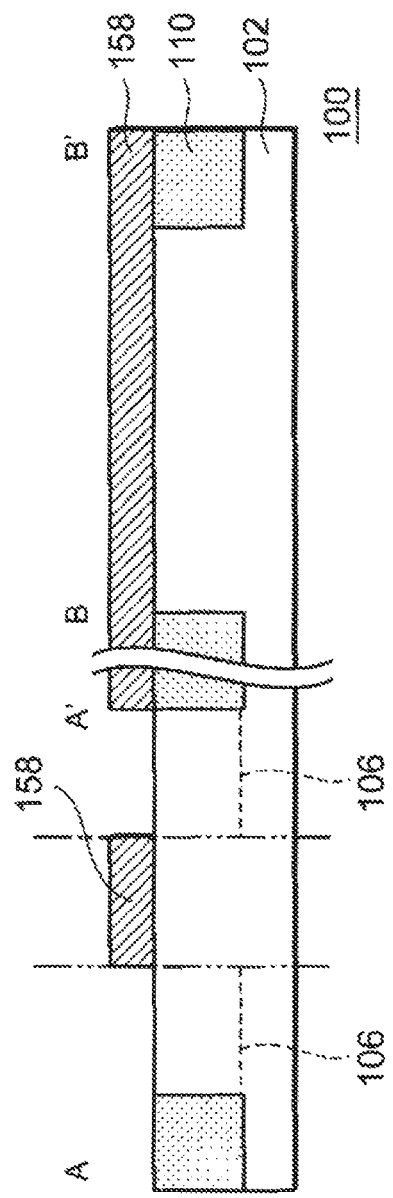

First, a device isolation insulating film 110 is formed on one surface of a substrate 102 (FIG. 3A). The device isolation insulating film 110 can have, for example, an STI (shallow trench isolation) feature. The film thickness of the device isolation insulating film 110 can be on the order of, for example, 300 nm to 1 μm, though not particularly limited. Subsequently, a resist film 158 to expose the region being formed an offset region 106 is formed on the substrate 102. Subsequently, by use of the resist film 158 as a mask, an offset region 106 is formed on the whole area of the substrate 102 by performing the ion implantation of dopant ions of an n-type (a first conductivity type), such as phosphorus (P) ions, (FIG. 3B). The n-type dopant concentration of the offset region 106 can be on the order of, for example, $1 \times 10^{16}$ atoms/cm$^3$ to $1 \times 10^{18}$ atoms/cm$^3$. After that, the resist film 158 is removed.

Subsequently, though not illustrated, a resist film 158 whose region where a well 104 is to be formed opens is formed on the substrate 102. Next, by use of this resist film as a mask, a well 104 is formed on the whole area of the substrate 102 by performing the ion implantation of dopant ions of a p-type (a second conductivity type), such as boron (B) ions. The p-type dopant concentration of the well 104 can be on the order of, for example, 1 E15 atoms/cm$^3$ to 1E17 atoms/cm$^3$. After that, the resist film 158 is removed.

Subsequently, a thermally-oxidized film 160 is formed on one surface of the substrate 102, and on top of this thermally-oxidized film 160 there is formed a resist film 170 in which an opening 172 for forming a trench 162 is formed. Next, the substrate 102 is exposed within the opening 172 by removing the thermally-oxidized film 160 by etching by use of the resist film 170 as a mask, (FIG. 4A). After that, the trench 162 is formed on the substrate 102 by performing the plasma etching of the substrate 102 by use of the resist film 170 as a mask (FIG. 4B). After that, the resist film 170 is removed. It is possible to adopt another method which involves removing the thermally-oxidized film 160 within the opening 172 by use of the resist film 170 as a mask, removing the resist 170 thereafter, and forming the trench 162 by use of the remaining thermally-oxidized film 160 as a mask. In this embodiment, the depth of the trench 162 can be on the order of, for example, 500 nm to 2 μm.

Subsequently, dopant ions of the p-type (the second conductivity type), such as boron (B) ions, are perpendicularly implanted in the whole area of the substrate 102 in a self-aligning manner. As a result of this, a p-type first high-concentration region 130 and a p-type second high-concentration region 132 are formed in the bottom portion of the trench 162 and on the surface of the substrate 102, respectively (FIG. 5A).

In general, if the second conductivity type dopant concentration in the channel region is increased, transistors become less apt to work. For this reason, it is preferred that the second conductivity type dopant concentration be controlled so that it does not increase more than necessary. However, in the technique described in Japanese Patent Laid-Open No. 2008-53468, oblique ion implantation is performed in the channel region. If ion implantation is performed in an oblique manner like this, in the bottom portion of the trench, there occur places where dopant ions are not implanted in portions shielded by wall portions of the trench. For this reason, there is the possibility that the second conductivity type dopant concentration decreases in corner portions of the bottom portion of the trench where electric field concentration is particularly apt to occur. Also, as a whole, the dopant concentration becomes higher on the substrate surface than in the bottom portion of the trench. For this reason, if a sufficient amount of dopant ions is to be introduced into the bottom portion of the trench, dopant ions are introduced onto the substrate surface in quantities more than necessary. In that case, the depth of portions of high dopant ion concentration increases on the substrate surface. Thus the length of the side wall portions, which should essentially work as transistors, decreases to cause the result that the current driving capability of transistors decreases. In regions sideward from the trench adjacent to the source region and the drain region on the substrate surface, breakdown voltage decreases if the second conductivity type dopant concentration increases. For this reason, it is necessary to set, in particular, the second conductivity type dopant concentration of the substrate surface so that it does not become higher than necessary.

In the present embodiment of the method according to the present invention, it is possible to perform control so that the second conductivity type dopant concentration of the whole channel region does not become higher than necessary, for example, by performing the ion implantation in a direction perpendicular to the substrate. This allows better controlling the second conductivity type dopant concentration of the bottom portion of the trench relative to the second conductivity type dopant concentration of the substrate surface. It is preferred that the second conductivity type dopant concentration of the bottom portion of the trench is greater than or approximately equal to the second conductivity type dopant concentration of the substrate surface bounding the trench, with the concentration of both regions preferably being substantially greater than that of the channel region where it bounds intermediate portions of the trench. As a result of this, it is possible to improve the subthreshold characteristics of transistors while keeping the driving capability of transistors at an appropriate level and it is also possible to prevent a decrease in breakdown voltage.

Incidentally, for example, when a plurality of trenches are formed in the width direction of the gate, variations may sometimes occur in the depth of the plurality of trenches due to variations in the etching rate in an in-plane direction. If there are such variations in the trench depth, variations occur in the driving capability of transistors. However, by setting the second conductivity type dopant concentration of the bottom portion of the trench at a high value, it is possible to relatively reduce the contribution of the driving capability of transistors in this portion and it is possible to obtain the effect that variations in the driving capability of transistors due to variations in the trench depth can be reduced. Therefore, when the second conductivity type dopant concentration of the bottom portion of the trench is made higher than the second conductivity type dopant concentration of the substrate surface, it is possible to reduce variations in the driving capability of transistors and it is also possible to improve the subthreshold characteristics of transistors. Also, it is possible to prevent a decrease in breakdown voltage.

The p-type dopant concentration of the first high-concentration region 130 can be lower than the n-type dopant concentration of the offset region 106. For this reason, in the offset region 106, the conductivity of the surface of the substrate 102 becomes the n-type. In another example, it is possible to perform the ion implantation of dopant ions for forming the first high-concentration region 130 and the second high-concentration region 132, with the region where the offset region 106 is formed covered with a resist film.

In this example, the p-type dopant concentration in the first high-concentration region 130 and the p-type dopant concentration in the second high-concentration region 132 can be equal to each other. The dopant concentration in the first high-concentration region 130 and the second high-concentration region 132 can be higher than the dopant concentration of the well 104 of the same conductivity type and lower than the dopant concentration of the offset region 106 of the opposite conductivity type. The p-type dopant concentration in the first high-concentration region 130 and the second high-concentration region 132 can be on the order of, for example, 5 E15 atoms/cm$^3$ to 5E17 atoms/cm$^3$.

Figure 6A:
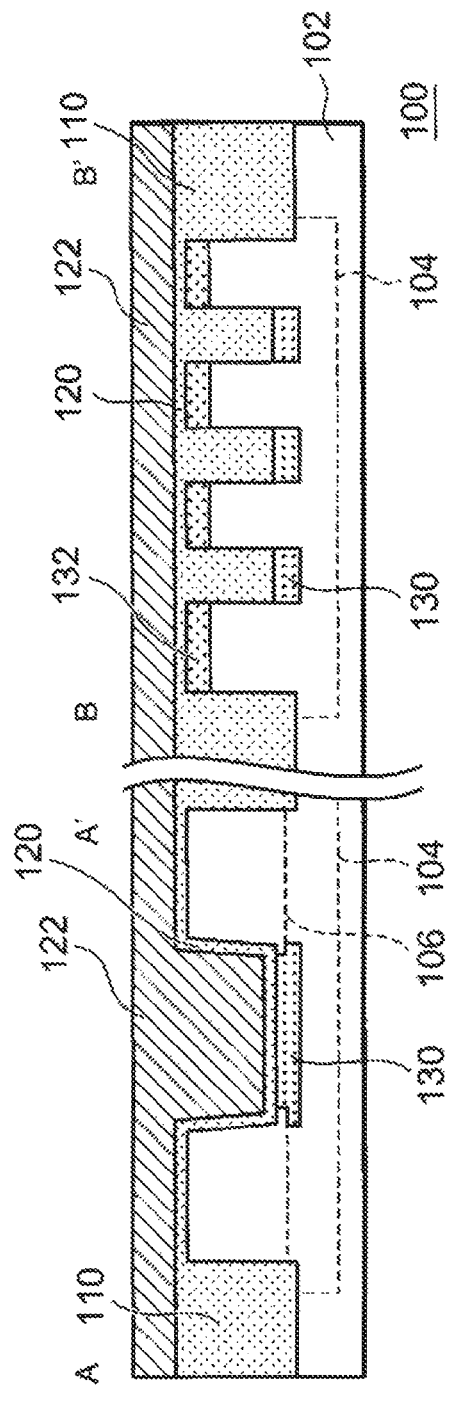
FIGS. 6A and 6B are sectional views illustrating an example of steps of the procedure for manufacturing the semiconductor device in the embodiment of the present invention.
Figure 6B:
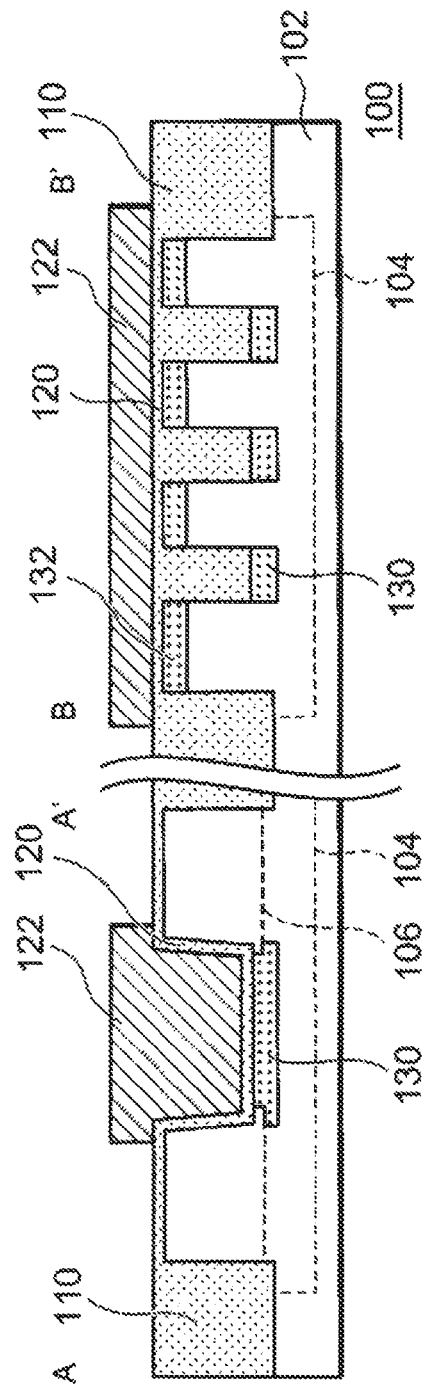

Subsequently, after the temporary removal of the thermally-oxidized film 160 with diluted fluorine or the like, a gate insulating film 120 is formed in the trench 162 and on the surface of the substrate 102 by thermally oxidizing the surface of the substrate 120 (FIG. 5B). After that, a conductive film which becomes a gate electrode 122, is formed on the whole area of the substrate 102 (FIG. 6A). The conductive film which becomes the gate electrode 122 can be formed from polysilicon, for example. Next, the gate electrode 122 and the gate insulating film 120 are patterned in gate shape (FIGS. 6A and 7A).

Subsequently, a side wall 124 is formed on the side wall of the gate electrode 122 (FIG. 7B). The side wall 124 can be formed from an insulating film of an oxide film, a nitride film or the like. After that, a source region 112 and a drain region 113 are formed by performing the ion implantation of n-type dopant ions, such as phosphorus (P) ions, on the whole area of the substrate 102 by use of the gate electrode 122 and the side wall 124 as masks (FIG. 8). The n-type dopant concentration in the source region 112 and the drain region 113 can be on the order of, for example, 1×1020 atoms/cm$^3$ to 1×1022 atoms/cm$^3$.

Subsequently, a silicide layer 114 and a silicide layer 126 are formed on the surface of the substrate 102 and the surface of the gate electrode 122, respectively. After that, an interlayer dielectric film 140 is formed on the whole area of the substrate 102, a contact hole is formed in the interlayer dielectric film 140, and this contact hole is buried with a conductive material, whereby a contact 150 is formed. As a result of this, the semiconductor device 100 of the configuration shown in FIGS. 1A to 1C is obtained.

According to the above procedure, it is possible to form the first high-concentration region 130 and the second high-concentration region 132 by performing single ion implantation. The first high-concentration region 130 and the second high-concentration region 132 are formed separately from the procedure for forming the well 104 which becomes a channel region 108. For this reason, it is unnecessary to cause the second conductive type dopant ions contained in the first high-concentration region 130 and the second high-concentration region 132 to diffuse. As a result of this, it is possible to increase the dopant concentration only in desired regions without increasing the second conductivity type dopant concentration in the channel region 108 to a level higher than necessary, it is possible to prevent actions like those of parasitic transistors, and it is possible to prevent phenomena such as hump and kink. This enables the subthreshold characteristics of transistor to be improved.

Next, another example of a procedure for manufacturing a semiconductor device 100 will be described.

The procedure for manufacturing a semiconductor device 100 differs from the example described with reference to FIGS. 1A to 1C, FIGS. 3A and 3B to FIG. 8. FIGS. 9A and 9B to FIGS. 14A to 14C are sectional views illustrating steps of a procedure for manufacturing the semiconductor device 100 in this example. Points where the two procedures differ from each other will be mainly described below.

First, a device isolation insulating film 110 and an offset region 106 are formed on a substrate 102 in the same way as the procedure described with reference to FIGS. 3A and 3B. After that, a well 104 is formed in the same way as described with reference to FIG. 4A.

Subsequently, dopant ions of a p-type (a second conductivity type), such as boron (B) ions, are perpendicularly implanted in the whole area of the substrate 102. The ion implantation can be performed by dividing it into implantation which involves targeting the surface of the substrate 102 and implantation which involves targeting a prescribed depth. A prescribed depth can be a depth corresponding to a bottom portion of a trench 162 when the trench 162 is formed later.

A second high-concentration region 132 is formed by performing the ion implantation which involves targeting the surface of the substrate 102 (FIG. 9A). The p-type dopant concentration of a first high-concentration region 130 can be lower than the n-type dopant concentration of the offset region 106. For this reason, in the offset region 106, the conductivity of the surface of the substrate 102 becomes an n-type and the second high-concentration region 132 is not formed. In another example, it is also possible to perform the ion implantation of dopant ions for forming the first high-concentration region 130, with a region where the offset region 106 is formed covered with a resist film.

The first high-concentration region 130 is formed by performing the ion implantation which involves targeting a prescribed depth (FIG. 9B). Although the dopant concentration of the second high-concentration region 132 and the dopant concentration of the first high-concentration region 130 may be equal to each other, it is also possible to make the dopant concentration of the first high-concentration region 130 higher.

It is possible to form the first high-concentration region 130 and the second high-concentration region 132 by performing ion implantation, with the resist film for forming the well 104 kept remaining. Either the first high-concentration region 130 or the second high-concentration region 132 may be formed earlier than the other.

Subsequently, a thermally-oxidized film 160 and a resist film 170 are formed on the substrate 102 in the same way as described with reference to FIG. 4A), and a trench 162 is formed by use of the resist film 170 as a mask (FIGS. 10A and 10B). After that, the resist film 170 is removed and the thermally-oxidized film 160 is then removed. Subsequently, a gate insulating film 120 is formed in the trench 162 and on the surface of the substrate 102 by thermally oxidizing the surface of the substrate 102 (FIG. 11A). The processing thereafter can be performed by adopting the procedure described with reference to FIGS. 6A to 6B to FIG. 8 and FIGS. 1A to 1C (FIG. 11B to FIG. 14A to 14C).

Figure 14A:
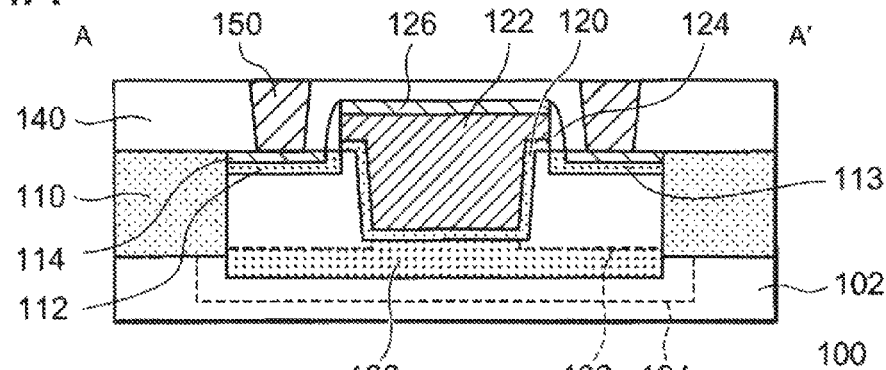
FIGS. 14A to 14C are sectional views illustrating another example of steps of the procedure for manufacturing the semiconductor device in the embodiment of the present invention.
Figure 14B:
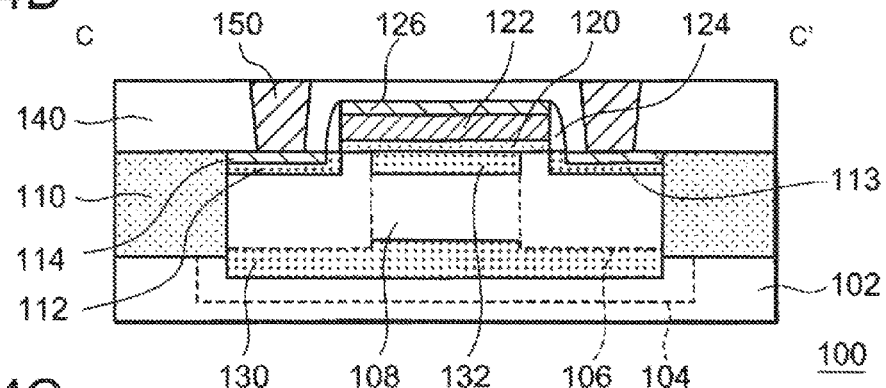
Figure 14C:
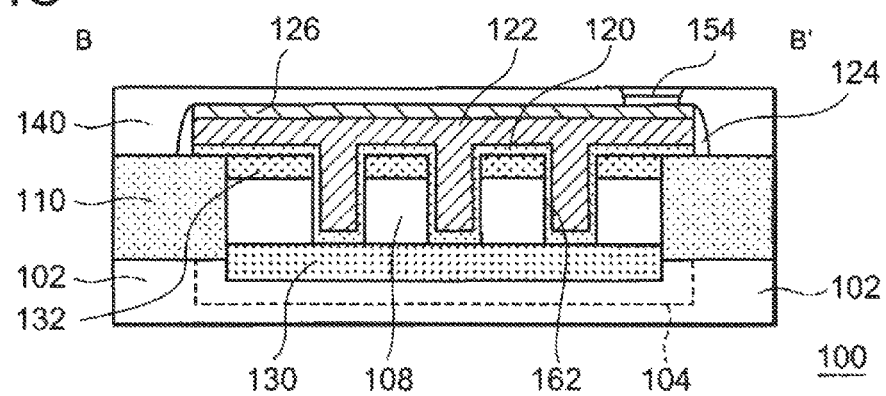

The semiconductor device 100 of the configuration shown in FIG. 14A to 14C is obtained by adopting the above procedure. FIG. 4A corresponds to an A-A' sectional view of FIG. 2, FIG. 14B corresponds to a C-C' sectional view of FIG. 2, and FIG. 14C corresponds to a B-B' sectional view of FIG. 2.

FIG. 15 and FIGS. 16A to 16C are sectional views illustrating a further example of steps of a procedure for manufacturing a semiconductor device 100.

In this example, the procedure differs from the procedure described above in that a first high-concentration region 130 is formed by performing ion implantation twice. As a result of this ion implantation, it is possible to make the dopant concentration of the first high-concentration region 130 higher than the dopant concentration of a second high-concentration region 132.

In this example, following the procedure for manufacturing the semiconductor device 100 shown in FIGS. 14A to 14C, the first high-concentration region 130 is first formed in the same way as the procedure described with reference to FIG. 9B by performing ion implantation before the formation of a trench 162. In the example shown in FIGS. 9A and 9B, the procedure consists of ion implantation which involves targeting the surface of the substrate 102 and ion implantation which involves targeting a prescribed depth. In the present example, however, only the ion implantation which involves targeting a prescribed depth is performed. As a result of this, the semiconductor device 100 of the configuration shown in FIG. 15 is obtained.

Figure 16A:
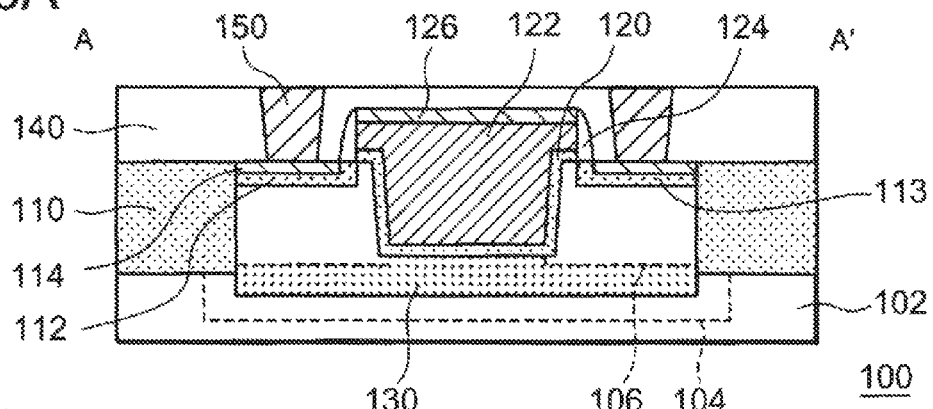
FIGS. 16A to 16C are sectional views illustrating a further example of steps of the procedure for manufacturing the semiconductor device in the embodiment of the present invention.
Figure 16B:
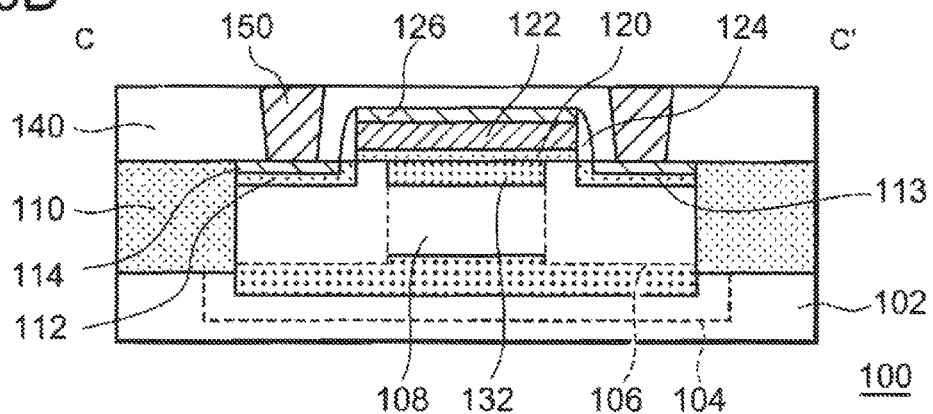
Figure 16C:
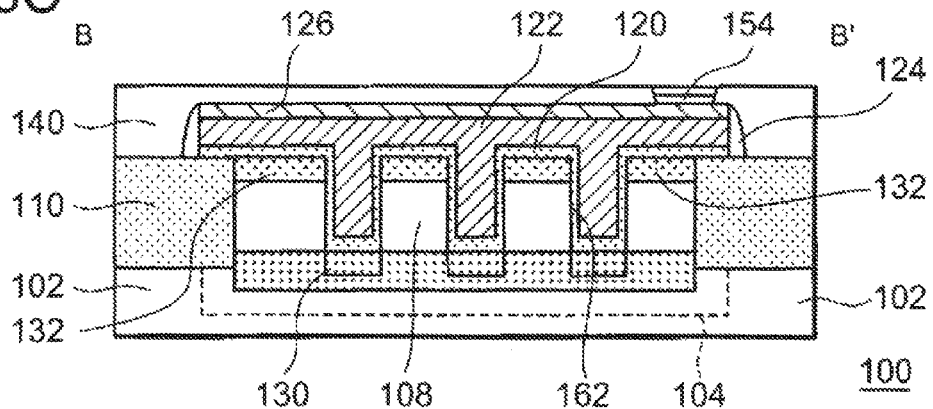

Thereafter, after the formation of the trench 162 in the substrate 102, following the procedure for manufacturing the semiconductor device 100 of the configuration shown in FIGS. 1A to 1C, in the same way as in the procedure described with reference to FIG. 5A, the first high-concentration region 130 and the second high-concentration region 132 are formed by performing ion implantation on the whole area of the substrate 102. The p-type dopant concentration in this stage is such that the p-type dopant concentration of the first high-concentration region 130 and the p-type dopant concentration of the second high-concentration region 132 are equal to each other. However, because in the first high-concentration region 130 dopant ions have already been introduced, it is possible to make the dopant concentration of the first high-concentration region 130 higher than the dopant concentration of the second high-concentration region 132. The semiconductor device 100 of the configuration shown in FIGS. 16A to 16C is obtained by adopting the above procedure. FIGS. 16A to 16C are sectional views illustrating a further example of the configuration of the semiconductor device 100 in this embodiment. FIG. 16A corresponds to an A-A' sectional view of FIG. 2, FIG. 16B corresponds to a C-C' sectional view of FIG. 2, and FIG. 16C corresponds to a B-B' sectional view of FIG. 2.

Thanks to the above configuration, it is possible to obtain the semiconductor device 100 which is such that in the channel region 108, the second conductivity type dopant concentration of the surface of the substrate 102 and of the bottom portion of the trench 162 is higher than the second conductivity type dopant concentration of portions sideward from the trench 162 and the second conductivity type dopant concentration of the bottom portion of the trench 162 is higher than the second conductivity type dopant concentration of the surface of the substrate 102.

As described above, according to the configuration of the semiconductor device 100 in this embodiment, in the top and bottom ends of the trench 162 of the channel region 108 where electric field concentration is apt to occur, the second conductivity type dopant concentration is higher than in other regions and therefore it is possible to increase the threshold voltage in these portions. For this reason, it is possible to prevent actions like those of parasitic transistors and it is possible to prevent phenomena such as hump and kink from occurring. As a result of this, it is possible to improve the subthreshold characteristics of transistors.

On the other hand, there is the problem that if the second conductivity type dopant concentration in the channel region 108 is increased, transistors become less apt to work. For this reason, it is preferred that the second conductivity type dopant concentration be controlled so that it does not increase more than necessary. In this embodiment, it is ensured that the second conductivity type dopant concentration of the bottom portion of the trench is higher than the second conductivity type dopant concentration of the substrate surface. For this reason, it is possible to perform control so that the second conductivity type dopant concentration of the whole channel region 108 does not become higher than necessary, for example, by making the second conductivity type dopant concentration of the bottom portion of the trench and the second conductivity type dopant concentration of the substrate surface equal to each other. As a result of this, it is possible to improve the subthreshold characteristics of transistors while keeping the driving capability of transistors appropriate and it is also possible to prevent a decrease in breakdown voltage.

Also, by increasing the dopant concentration of the first high-concentration region 130, in a case where a plurality of trenches are formed in the gate width direction, it is also possible to reduce variations in the driving capability of transistors due to variation in the depth of the trenches.

In this embodiment, the first high-concentration region 130 and the second high-concentration region 132 are formed separately from the procedure for forming the well 104 which becomes a channel region 108. For this reason, it is unnecessary to cause the second conductive type dopant ions contained in the first high-concentration region 130 and the second high-concentration region 132 to diffuse. As a result of this, it is possible to increase the dopant concentration only in desired regions without increasing the second conductivity type dopant concentration in the channel region 108 to a level higher than necessary, it is possible to prevent actions like those of parasitic transistors, and it is possible to prevent phenomena such as hump and kink. This enables the subthreshold characteristics of transistor to be improved.

The embodiments of the present invention were described above with reference to the drawings. However, these embodiments are illustrative of the present invention and it is possible to adopt various configurations other than those described above. Also, a method of realizing the present invention is disclosed below in the present invention.

[Addition A]

A method of manufacturing a semiconductor device comprising:
forming a device isolation film on a substrate;
forming a photoresist on the substrate;
forming a pattern on the photoresist so as to expose a gate region;
forming a trench in the substrate through the pattern; forming a channel region by removing the pattern and implanting dopant ions of a second conductivity type perpendicular to the substrate;
forming a gate electrode in the trench formed on the substrate; and
forming a source region and a drain region by implanting dopant ions of a first conductivity type in the regions laterally adjacent the channel region of the substrate.

[Addition B]

The method of manufacturing a semiconductor device according to addition A, wherein the step of implanting dopant ions of a second conductivity type includes a step of implanting dopant ions of the second conductivity type on a surface of the substrate and in a bottom portion of the trench by implanting dopant ions of the second conductivity type after forming the trench.

[Addition C]

The method of manufacturing a semiconductor device according to addition A, wherein the step of forming a channel region includes a step of implanting dopant ions of the second conductivity type perpendicularly on the substrate by use of the substrate surface as a target and a step of implanting dopant ions of the second conductivity type by use of a predetermined depth which becomes a bottom portion of the trench as a target, before forming the trench.

[Addition D]

The method of manufacturing a semiconductor device according to addition B, including a step of implanting dopant ions of the second conductivity type by use of a predetermined depth which becomes a bottom portion of the trench as a target before forming the trench.

What is claimed is:

1. A semiconductor device comprising:
   a source region and a drain region, both of which are of a first conductivity type and formed in a substrate;
   a channel region of a second conductivity type formed in the substrate and arranged, in a plane view, in a first direction between the source region and the drain region;
   a trench formed in the substrate between the source region and the drain region and having a side surface of the trench extending in the first direction between the source region and the drain region;
   a gate insulating film formed in the trench;
   a gate electrode formed in the trench through the gate insulating film such that a portion of the channel region sideward, in a second direction crossing and being in a same plane as the first direction, from the side surface of the trench, in the first direction both the source region and the drain region and is arranged between the source region and the drain region; and
   a buried region of the second conductivity type formed directly below the trench, directly below the source region and directly below the drain region such that the buried region contacts a bottom portion of the trench and device isolation regions, and that a dopant concentration of the second conductivity type of the buried region is higher than a dopant concentration of the second conductivity type of the portion of the channel region sideward from the side surface of the trench.

2. The semiconductor device according to claim 1, wherein the buried region contacts the drain region.

3. The semiconductor device according to claim 2, wherein the buried region contacts the source region.

4. The semiconductor device according to claim 1, wherein the buried region contacts the source region.

5. The semiconductor device according to claim 1, wherein a plurality of trenches are formed along the second direction.

6. The semiconductor device according to claim 1, wherein the dopant concentration of the buried region is greater than the dopant concentration of the channel region at a surface of the substrate.

7. The semiconductor device according to claim 1, wherein a source-drain current path is arranged, in the first direction between the source region and the drain region, along the portion of the channel region sideward, in a second direction, from the side surface of the trench.

8. A semiconductor device comprising:
   a first region and a second region, both of which are of a first conductivity type and arranged in a substrate;
   a channel region of a second conductivity type arranged, in the substrate, in a first direction between the first region and the second region;
   a trench formed in the substrate between the first region and the second region and having a side surface of the trench extending in the first direction between the first region and the second region;
   a gate insulating film formed in the trench;
   a gate electrode formed in the trench through the gate insulating film such that a portion of the channel region sideward, in a second direction crossing and in a same plane as the first direction, from the side surface of the trench, in the first direction both the first region and the second region and is arranged between the first region and the second region; and
   a buried region of the second conductivity type formed directly below the trench, directly below the first region and directly below the second region such that the buried region contacts the trench and device isolation regions, and an impurity concentration of the buried region is higher than an impurity concentration of the portion of the channel region sideward from the side surface of the trench.

9. The semiconductor device according to claim 8, wherein the buried region contacts the second region.

10. The semiconductor device according to claim 9, wherein the buried region contacts the first region.

11. The semiconductor device according to claim 8, wherein the buried region contacts the first region.

12. The semiconductor device according to claim 8, wherein a plurality of trenches are formed along the second direction.

13. The semiconductor device according to claim 8, wherein the dopant concentration of the buried region is greater than the dopant concentration of the channel region at a surface of the substrate.

14. The semiconductor device according to claim 8, wherein a source-drain current path is arranged, in the first direction between the first region and the second region, along the portion of the channel region sideward, in a second direction, from the side surface of the trench.

15. The semiconductor device according to claim 8, wherein the first region and the second region serve as a source region and a drain region, respectively.

16. The semiconductor device according to claim 1, wherein the dopant of the second conductivity type is a p-type dopant.

17. The semiconductor device according to claim 1, wherein the dopant of the second conductivity type is boron.

18. The semiconductor device according to claim 1, wherein the dopant concentration of the second conductivity type is from 1E15 atoms/cm$^3$ to 1E17 atoms/cm$^3$.

19. The semiconductor device according to claim 1, wherein the trench has a depth of 500 nm to 2 μm.

20. A semiconductor device comprising:
   a source region and a drain region, both of which are of a first conductivity type and formed in a substrate, the source region and the drain region having an n dopant concentration of from $1 \times 10^{20}$ cm$^3$ to $1 \times 10^{22}$ atoms cm$^3$;
   a channel region of a second conductivity type formed in the substrate and arranged, in a plane view, in a first direction between the source region and the drain region;
   a trench formed in the substrate between the source region and the drain region and having a side surface of the trench extending in the first direction between the source region and the drain region;
   a gate insulating film formed in the trench;
   a gate electrode formed in the trench through the gate insulating film such that a portion of the channel region sideward, in a second direction crossing and being in a same plane as the first direction, from the side surface of the trench, in the first direction both the source region and the drain region and is arranged between the source region and the drain region; and a buried region of the second conductivity type formed directly below the trench, directly below the source region and directly below the drain region such that the buried region contacts a bottom portion of the trench and device isolation regions, and such that a p dopant concentration of the second conductivity type of the buried region is higher than a dopant concentration of the second conductivity type of the portion of the channel region sideward from the side surface of the trench, the p dopant being boron at a concentration of $5E15\ cm^3$ to $5E17\ cm^3$.

* * * * *